(12) United States Patent
Cheung et al.

(10) Patent No.: US 6,541,908 B1
(45) Date of Patent: Apr. 1, 2003

(54) ELECTRONIC LIGHT EMISSIVE DISPLAYS INCORPORATING TRANSPARENT AND CONDUCTIVE ZINC OXIDE THIN FILM

(75) Inventors: Jeffrey T. Cheung, Thousand Oaks, CA (US); George M. Williams, Thousand Oaks, CA (US); Leslie F. Warren, Jr., Camarillo, CA (US); Zhiming Zhuang, Thousand Oaks, CA (US)

(73) Assignee: Rockwell Science Center, LLC, Thousand Oaks, CA (US)

( * ) Notice: Subject to any disclaimer, the term of this patent is extended or adjusted under 35 U.S.C. 154(b) by 0 days.

(21) Appl. No.: 09/410,130

(22) Filed: Sep. 30, 1999

(51) Int. Cl.$^7$ .................................................. H01J 1/62
(52) U.S. Cl. .......................... 313/503; 313/504; 257/43; 257/101
(58) Field of Search .................... 313/503, 499, 313/504–506; 315/169.3; 257/43, 11, 12, 13, 101, 607

(56) References Cited

U.S. PATENT DOCUMENTS 4,975,338 A * 12/1990 Kageyama et al. ......... 313/503
5,643,685 A * 7/1997 Torikoshi et al. ........... 313/503
5,670,839 A * 9/1997 Noma ........................ 313/503
5,780,966 A * 7/1998 Kato et al. .................. 313/506

* cited by examiner

Primary Examiner—Ashok Patel
(74) Attorney, Agent, or Firm—Craig E. Shinners

(57) ABSTRACT

The present invention provides co-doped zinc oxide to flat panel, light emissive display devices and vacuum microelectronic devices to improve their efficiency and lifetime. This material has a low growth temperature and is compatible with metal oxide semiconductor (MOS) processing technology. It is tranparent, chemically stable and has a low work function, which result in many advantages when being used as the cathode for the aforementioned devices. In one embodiment of the emissive display device, an organic light diode (OLED) display has a high work function metal anode, such as platinum (Pt), gold (Au) or nickel (Ni) and a low work function co-doped zinc oxide cathode. Because of the energy level alignment provided by these two materials, the potential energy barriers to injection of electrons from the cathode and holes from the anode into the organic emissive medium are minimized so the display device operates more efficiently.

27 Claims, 6 Drawing Sheets

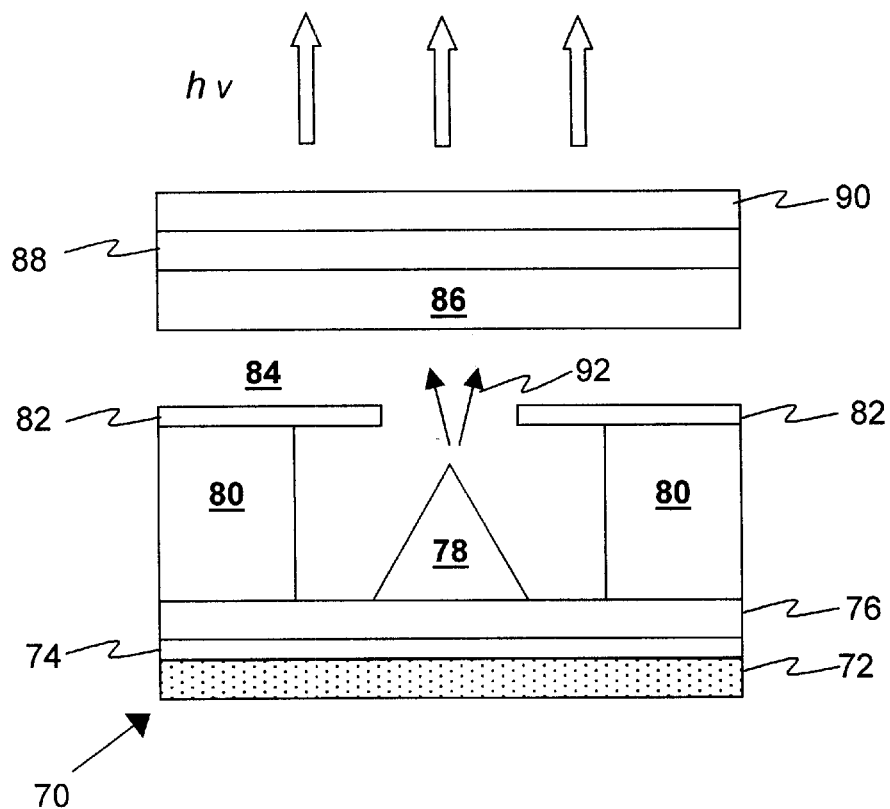
FIGURE 8
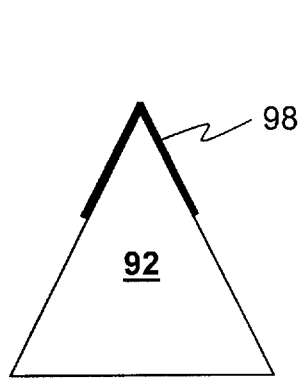
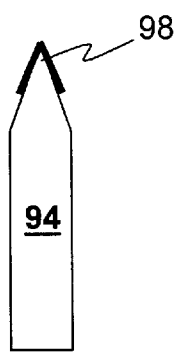
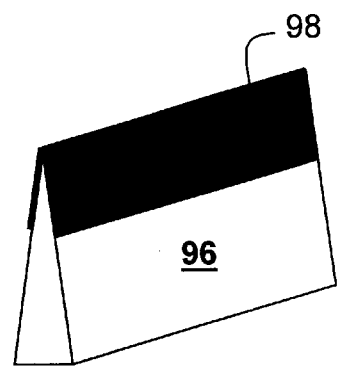
FIGURE 9A     FIGURE 9B     FIGURE 9C

ELECTRONIC LIGHT EMISSIVE DISPLAYS INCORPORATING TRANSPARENT AND CONDUCTIVE ZINC OXIDE THIN FILM

BACKGROUND OF THE INVENTION

1. Field of the Invention

The present invention relates to the applications of co-coped n-type zinc oxide thin film as a chemically stable and low work function cathode to Organic Light Emissive Diode (OLED) display, Field Emission Display (FED) and vacuum microelectronic display devices.

2. Description of Related Art

Display devices are a fast growing segment of the electronics market. Historically, commercially viable displays have relied on cathode ray tube (CRT) and liquid crystal display (LCD) technologies due to reliability and affordability. CRT technology is mature and able to achieve high resolution, high luminance (brightness), low cost and long life. Unfortunately, CRT displays require high operating voltages and are too heavy for portable applications. CRTs also have a large bulky form factor. More recently, flat panel LCDs have gained acceptance in many applications since they operate at power levels compatible with battery operation, are lightweight and have a thin form factor. LCD panels either reflect or transmit light so an external light source is required. LCD panels also have a limited viewing angle so the user may not be able to see the displayed information from an oblique viewing angle. Although the viewing angle for LCD displays has improved over the years, they are still inferior compared to CRTs and other emissive display technologies. Another weakness of LCD displays is that the liquid crystal material response to a stimulus is intrinsically slow at low temperatures. Thus, LCD displays are a poor choice for portable, automotive or military applications where operation at extreme low temperature may be required. Accordingly, there is great need for an inexpensive low-power display technology that exhibits real-time imaging capability in the flat panel form factor over an extended operating temperature range.

There are a number of alternative technologies that offer the luminous efficiency and resolution of a CRT and the flat panel form factor of an LCD that are compatible with portable applications. Light emissive devices have a form factor of an LCD display but are not dependent on external light sources. Emissive devices also have the wide viewing angle of a CRT and will operate over an extended temperature range. Two examples of emissive devices are the organic light emitting diode (OLED) display devices and the field effect display devices. Emissive display devices are lightweight and capable of projecting video rate images with high contrast ratio over an extended temperature range. Emissive displays hold great promise as an alternative to LCDs because they have superior viewing angle characteristics and high video rates. Moreover, unlike LCDs, the response rate of emissive displays is not affected by a low ambient operating temperature.

FIG. 1 illustrates a portion of a prior art OLED device 10. Device 10 has an opaque cathode electrode 12 in a spaced-apart arrangement with a transparent anode electrode 14 deposited on a transparent substrate 18. An organic emissive medium 20 is sandwiched between cathode electrode 12 and an anode electrode 14 with pixels defined wherever the cathode electrode overlaps the anode electrode. Layer 23 may be applied over cathode electrode 12 to encapsulate device 10 and protect the device. When electrons injected into medium 20 from the cathode combine with holes injected at the anode, light, denoted as hv and illustrated as downwardly projected arrows, is generated and transmitted through transparent anode 14 and substrate 18.

The cathode electrode 12 is usually an opaque reflective low work function metal such as an alkaline earth metal or reactive metal alloy. Examples of prior art cathode electrodes include calcium, magnesium/silver, or aluminum/lithium. Typically, the anode electrode 14 is a high work function thin film of transparent indium tin oxide (ITO). The phrase "work function" refers to the energy difference, in electron volts (eV), between a free electron and an electron at the Fermi level of the material. The phrase "Fermi level" indicates the energy level at which the probability that a state of energy is occupied is equal to one half. To minimize the energy barriers, the work function of the cathode needs to be low so that the Fermi level closely matches the energy level of the lowest unoccupied molecular orbital (LUMO) of the organic medium. Similarly, the work function of the anode needs to closely match the energy level of the highest occupied molecular orbital (HOMO) of the organic medium. Since ITO is the material of choice for the transparent anode, prior art research has focused on use of alkaline earth metal cathodes having a low work function to achieve device efficiency. However, alkaline earth metals are extremely reactive and are not transparent.

A significant problem with prior art displays is that the interface between the electrodes and the emissive medium creates energy barriers that must be overcome before charge can be injected into the medium. Where the energy barrier at one electrode is much greater than at the other electrode, the supply voltage must be sufficient to overcome the larger barrier thereby increasing the power that must be supplied to the device. FIG. 2 illustrates the potential energy diagram of the prior art OLED device illustrated in FIG. 1. As indicated, the Fermi level of the ITO (work function is about 4.7 eV as indicated at 22) is above the HOMO energy level of the organic medium. For example, since the HOMO is about 4.9 eV for the MEH-PPV organic polymer, energy is required to inject holes, represented by $h^+$, over the potential energy barrier into the organic medium. Further, the Fermi level of the metal cathode (about 3 eV to 4 eV for typical alkaline earth metals as indicated at 24) is below the LUMO of the medium (about 2.8 eV), so energy is also required to inject electrons, represented by $e^-$, into medium 20. Thus, the operating voltage must be sufficient to overcome the potential barriers to inject both electrons and holes into the medium before light will be generated. In many prior art OLED devices, the imbalance in the ratio of hole injection and electron injection generates heat dissipation. Such heating contributes to degradation of the medium and low efficiency of the OLED device.

The use of ITO as the transparent electrode (anode) and a reactive low work function metal as the cathode also constrains OLED device design to the traditional architecture illustrated in FIG. 1. One example is a miniature OLED display integrated monolithically with the driving circuit on a silicon substrate. This device requires that the opaque reactive metal cathode (Ca, Mg) be deposited on the silicon backplane and the ITO anode to be deposited on the organic emissive medium. However, the reactive cathode readily oxidizes and may degrade the organic medium interface. Also, reactive metals are not compatible with the semiconductor processing technology and can degrade driving circuits on silicon substrates. Accordingly, a complicated semiconductor manufacturing process involving barrier layers is required to combine the prior art OLED display device with electronic elements on a common substrate. Clearly, what is needed is an OLED device with a design and a set component materials that may be processed and integrated on a common silicon substrate together with control circuits. It is desirable to have a transparent and stable cathode material with a low work function and a low processing temperature, so it can be used as a substitute for the reactive metal cathode in the prior art.

Field emission display (FED) devices represent another type of emissive display that is similar to traditional CRT display technology in that an independently addressable stream of electrons excites each pixel. Where the CRT uses a single electron source to sweep a single beam of electrons across the back of a phosphor screen, FED devices incorporate an array of emitters (the cathodes), each of which ejects a stream of electrons in the presence of an applied electric field to excite a corresponding pixel on an opposing display surface (the anode). By eliminating the single electron gun and the need to sweep the beam across the screen of the CRT display, the depth and, accordingly, the form factor of the FED display can be significantly reduced.

Each emitter in a FED device has a pyramidal or a conical top terminating in a sharp point coupled at the base to a cathode electrode. A control gate resides just above each emitter or group of emitters. Applying a voltage between each individually addressable gate and cathode electrode results in a steam of electrons, which excites a phosphor at the anode, thus resulting in visible light being generated. The anode electrode sets the bias voltage to attract the electron stream but need not be otherwise addressable. Unfortunately, prior art FEDs have an unacceptably short operational lifetime and require high operating voltages due to various material limitations related to the emitters. Most of the prior art FEDs have emitters that are made from materials such as silicon and refractory metals. Consequently, they have high work functions and require high operating voltages to generate sufficient field emitting electrons. Furthermore, an insulating layer of oxide gradually forms on the emitter surface, increasing its work function and acting as a barrier to electron emission which results in decreasing luminance and uneven brightness of the displayed image over the life of the display. Similar technical issues also impede the performance of vacuum microelectronics devices that mimic various types of vacuum tube electronic devices with individually gated solid-state micro electron emitters. Therefore, both FED and vacuum microelectronic devices will benefit from having an oxidation resistant, low work function electron emitter.

SUMMARY OF THE INVENTION

The present invention relates the use of co-doped zinc oxide (n-type) as the cathode of organic light emitting diode (OLED) displays, field emission displays (FEDs) and vacuum microelectronic devices. The invention overcomes the limitations in the prior art described above and other limitations in the prior art that will become apparent upon reading and understanding this specification. The present invention maximizes device efficiency, improves device reliability and extends the flexibility to new device architectures.

In one preferred embodiment, a co-doped zinc oxide film is deposited on a glass substrate. An emissive organic medium is sandwiched between the co-doped (n-type) zinc oxide cathode and an anode made with high work function metals such as gold (Au), platinum (Pt) or nickel (Ni). Light transmits through the zinc oxide cathode and the glass substrate. This device uses a low work function cathode and high work function anode to minimize the electron injection and hole injection energy barrier to maximize device efficiency.

In another preferred embodiment, a bi-directional OLED display has an emissive organic medium sandwiched between a transparent indium tin oxide (ITO) anode and a transparent co-doped zinc oxide cathode. Since both electrodes are transparent, light emits bi-directionally from both the top and the bottom of the device. The co-doped zinc oxide cathode has a low work function that minimizes the potential energy barrier to inject electrons from the cathode into the organic medium so the display device operates more efficiently. Since the co-doped zinc oxide thin film can be deposited at a low temperature, it can be deposited on the organic emissive medium without degrading the medium. This low temperature deposition process is preferred to fabricate any OLED device where the transparent ZnO cathode is not deposited on a glass substrate.

In another preferred embodiment of an emissive display device, the anode is a high work function metal, such as platinum (Pt) or gold (Au). The reflective, high work function metal anode minimizes the potential barrier to inject holes into the organic medium and provides an improved unidirectional display. The non-reactive metal anode may be deposited on silicon or another substrate with a co-doped zinc oxide as the transparent electrode (cathode) deposited and patterned on top of an organic layer. Since both electrodes are non-reactive, an emissive display device may be combined with control electronics on a single substrate. This embodiment is particularly useful for miniature display applications. Miniature flat-panel displays on silicon permit the integration of display drive electronics with the display on a common substrate. This type of miniature display provides high resolution and low cost particularly desired for wireless or mobile applications where low power and high efficiency can minimize weight and increase battery life.

The low work function and chemical robustness of the co-doped zinc oxide electrode also hold application as a field emitting material for FEDs and vacuum microelectronic devices. The present invention provides improved resistance to cathode oxidation common in prior art displays. The invention also provides high operation efficiency because of the low work function of the material.

In one embodiment, a thin film of co-doped zinc oxide is deposited on the emitter surface of FED devices or vacuum microelectronic devices. This coating minimizes performance degradation induced by surface oxidation of the emitters and enhances electron emission efficiency due to the low work function of this material.

Another embodiment describes a field emission light source. In this configuration, a plurality of transparent zinc oxide emitters is fabricated on a transparent substrate and a phosphor layer is applied to a metal anode. An electric field is applied between the emitter and the phosphor to accelerate electron streams toward the anode and bombard onto the phosphor. Light generated on the phosphor layer will transmit through the transparent cathode. In this device geometry, heat generated during the interaction between the electron streams and phosphor is dissipated in the metal anode. The high thermal conductivity of the metal anode effectively removes the heat and enables high power operation to result in high light intensity output.

BRIEF DESCRIPTION OF THE DRAWINGS

Referring now to the drawings in which like-reference numbers represent corresponding parts throughout:

FIG. 8 illustrates a schematic representation of a single pixel of a FED device.

FIGS. 9A, 9B and 9C illustrate various alternative structures for one emitter of the FED device of FIG. 8 with each emitter having a co-doped zinc oxide coating.

DETAILED DESCRIPTION OF A PREFERRED EMBODIMENT

Figure 1:
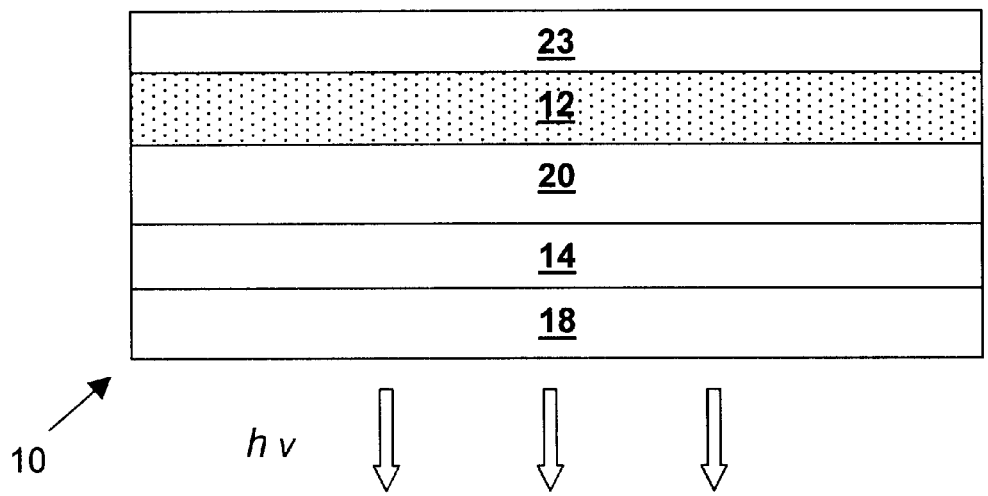
FIG. 1 illustrates a typical prior art organic light emission device having a metal cathode and an ITO anode.
Figure 2:
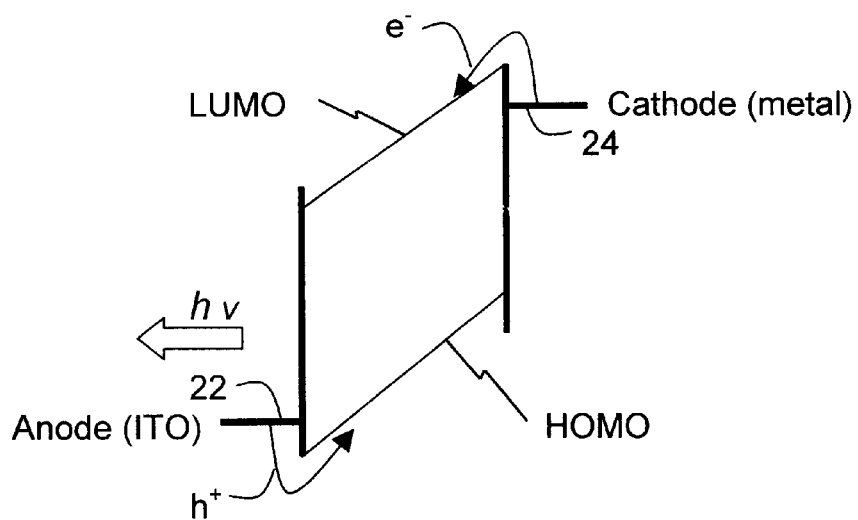
FIG. 2 illustrates the band diagram of a typical prior art OLED device depicting the potential energy barriers to injecting electrons and holes.

In the following description of the preferred embodiment, reference is made to the accompanying drawings, which form a part hereof, and in which is shown by way of illustration specific embodiments in which the invention may be practiced. In the following description, numerous specific details are set forth in order to provide a thorough understanding of the present invention. It will be apparent to one skilled in the art that the present invention may be practiced without these specific details. In the development of any actual implementation, numerous implementation-specific decisions must be made to achieve the developers' goals, which will vary for each implementation. Accordingly, in order not to obscure the present invention, well-known structures and techniques are not shown or discussed in detail. Further, it should also be noted that the elements shown in the drawings herein are not necessarily to scale, the intent being to illustrate the relationship of the elements.

The present invention relates to improved display technologies. The principles of the invention are illustrated and embodied in various emissive display systems suitable for use in generating a displayed image. The lightweight display systems have a small form factor, high resolution, high luminance (brightness), and long operating lifetime. Co-doped zinc oxide thin films that simultaneously incorporate gallium and hydrogen atoms as electron donors can address the material needs in aforementioned sections. The properties of co-doped zinc oxide thin film are described in a co-pending application entitled Transparent and Conductive Zinc Oxide Film with Low Growth Temperature, U.S. Ser. No. 09/281198 filed Mar. 30, 1999 assigned to Rockwell Science Center, LLC, the assignee of the present application by Jeffrey T. Cheung, a co-inventor of the present invention. The specification of the above-identified application is incorporated herein by reference. Compared to traditional n-type zinc oxide doped with a single dopant, the co-doped zinc oxide has a lower growth temperature, is compatible with OLED processing, and has a high electron concentration that results in a substantial raising of the Fermi level to achieve a low work function. All these properties are desirable to improve the performance of OLED, FED, and vacuum microelectronic devices.

Figure 3:
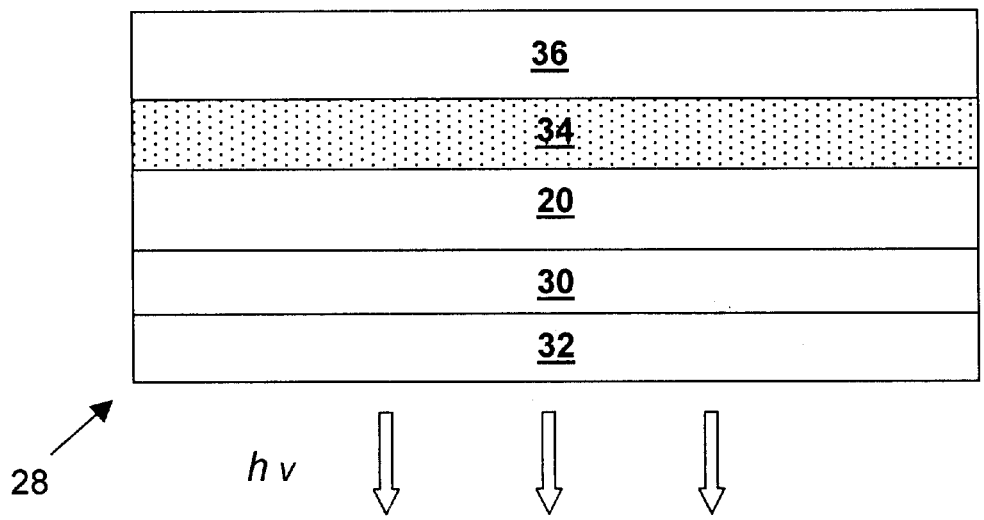
FIG. 3 illustrates a schematic representation of one embodiment of an OLED device having a co-doped zinc oxide cathode on glass substrate and a high work function metal anode.

Referring now to the drawings and particularly to FIG. 3, one embodiment of an improved organic light emitting diode (OLED) display device 28 is shown in schematic form in accordance with the present invention. In the embodiment of device 28, cathode 30 comprises a thin film of co-doped zinc oxide deposited on a transparent substrate 32. As used herein, the term "co-doped" means that the zinc oxide thin film is doped with both gallium (Ga) and hydrogen (H) as described in the above-referenced co-pending application. The cathode thin film is patterned using etching techniques or by deposition through a shadow mask. Substrate 32 is typically a soda lime glass substrate capable of withstanding deposition and processing temperatures in excess of 200° C. However, if substrate 32 is not otherwise subjected to high processing temperature, a plastic substrate can be used because of the low deposition temperature of the co-doped zinc oxide. With the present invention, the flexible substrate may be selected from a group consisting of acrylics, urethanes, polystyrenes, polycarbonates, styrene-acrylonitrile copolymers, styrene-butadiene copolymers, cellulosics, acrylonitrile-butadiene-styrene, polyvinylchloride, thermoplastic polyesters, polypropylene, nylons, polyester carbonates, ionomers, polyethyleneterephthate, and cyclic olefin copolymers. This wide range of substrate material enables the customization of the emissive display device to suit the application environment or price requirements.

Once cathode 30 is deposited and patterned, organic medium 20 is deposited on top of cathode 30. By way of example, wet chemical deposition or vacuum deposition may be used to deposit medium 20, it being recognized that the selected medium may determine the optimal deposition technique. If necessary, the medium is treated to evacuate any volatile solvents or impurities that may be introduced by the deposition technique. The thickness of medium 20 is an engineering consideration dependent on the particular choice of medium 20 and on the intended application. In most applications, the medium will be about 1,000 Angstroms thick. Medium 20 may be selected from known light emissive organic polymers, such as MEH-PPV, or small molecules, such as aluminum 8-hydroxyquinoline (Alq$_3$) or dye-doped Alq$_3$. Fluorescent metal chelate complexes or other suitable emissive organic materials may also be suitable for some applications as the light-emitting medium. Alternatively, medium 20 may comprise a hole transport layer, such as a tetraarylbenzidine derivative (TPD) or a TPD derivative (NPB), disposed proximate to the anode and an electron transport layer, such as Alq$_3$ disposed proximate to the cathode. Oftentimes two layers are used to force recombination at the layers' interface rather than at one of the electrodes. Advantageously, with the present invention the potential energy barriers at both electrodes are minimized so the display device will have substantially equal injection of holes and electrons. This balancing of charge carriers maximizes the possibility that carriers will recombine radiatively, thereby minimizing power dissipation since fewer carriers travel through the medium without combining to generate light.

Once the medium 20 is deposited, anode 34 is then deposited so that medium 20 is sandwiched between the anode and the cathode. Deposition of the anode may be by way of vacuum deposition at low temperatures, by example, below 50° C. although other deposition techniques are known and may be used. Preferably, anode 34 comprises a thin film of gold (Au), platinum (Pt) or nickel (Ni). More specifically, the anode is selected from metals having a Fermi level that is equal to or below the Highest Occupied Molecular Orbital (HOMO) energy level of the organic medium 20. During deposition, anode 34 is patterned such that the relationship between the cathode and anode electrodes will cooperate to form the desired pattern. Patterning is preferably performed using well-known semiconductor processing techniques such as a shadow mask. An encapsulating layer 36 is deposited on top of anode 34 to provide some protection from the environment.

With medium 20 sandwiched between the two electrodes, light is generated when the electrodes are electrically activated. When a voltage of sufficient magnitude is applied across anode 34 and cathode 30, electrons are injected into medium 20 from the cathode and holes are injected into medium 20 from the anode. When the injected holes and electrons combine in medium 20, light is emitted. Since the cathode 30 and the substrate 32 are transparent, the generated light, hv, is transmitted through the cathode and the substrate.

Figure 4:
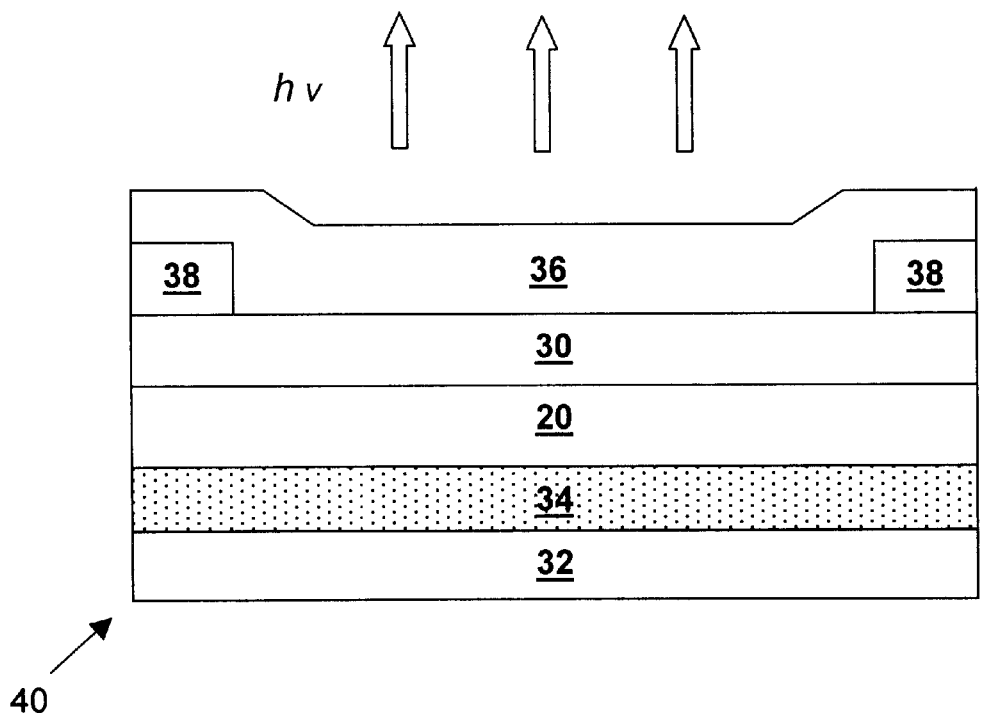
FIG. 4 illustrates a schematic representation of an OLED device having a high work function metal anode on a glass substrate and a co-doped zinc oxide thin film cathode.

FIG. 4 illustrates another preferred embodiment of a display in accordance with the present invention. Display device 40 is shown having a co-doped zinc oxide cathode 30 and emissive medium 20. The anode 34, which is deposited on substrate 32, is a high work function metal such as described above. A metal contact 38, preferably aluminum, is deposited and patterned on cathode 30 to make ohmic contact with the co-doped zinc oxide. A transparent encapsulating layer 36 is deposited to cover the metal contact and the exposed cathode to protect the device from the environment. Light generated in the organic medium transmits through the cathode.

Figure 5:
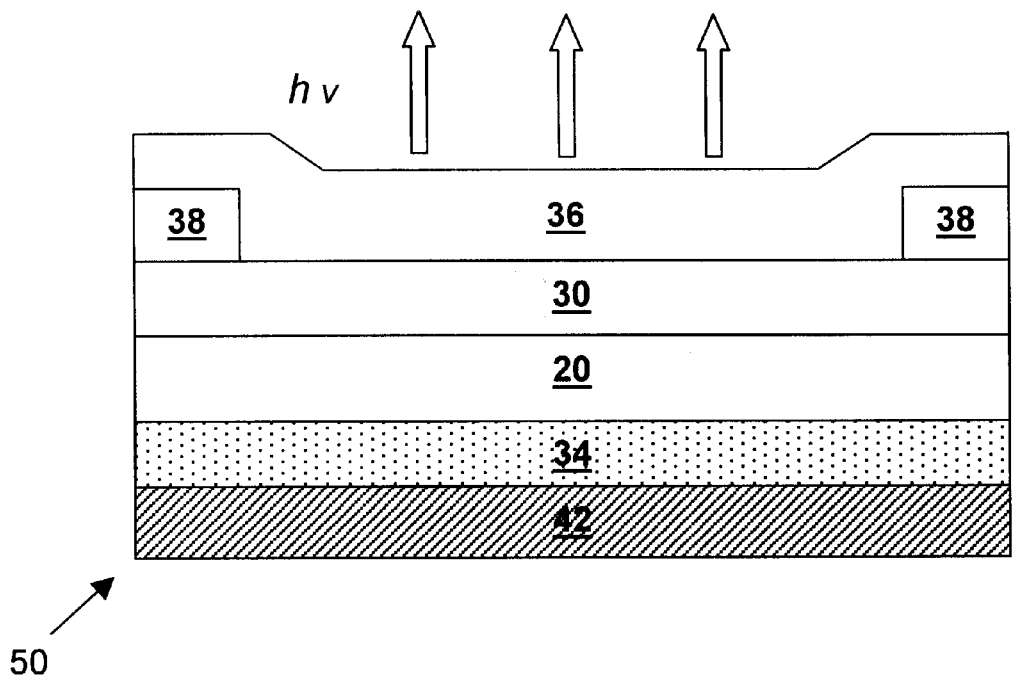
FIG. 5 illustrates a schematic representation of an OLED on a silicon substrate with monolithically integrated electronic driving circuits.

Another embodiment, illustrated in FIG. 5, is a miniature emissive display formed on a silicon substrate 42 containing an integrated circuit (not illustrated). The integrated circuit is created using standard semiconductor processing techniques well known in the art. After a layer of insulating oxide (not shown) is deposited and patterned on top of the substrate, the elements of display 50 are deposited and patterned. A high work function metal anode 34 is deposited on the substrate. More specifically, the anode is selected from metals that do not interact with silicon at temperature lower than 200° C. and have a Fermi level that is close to or below the HOMO energy level of the medium 20. Gold (Au) and platinum (Pt) are particularly well suited for this anode material. Connection between the integrated circuit and the anode is made by providing vias through the oxide layer to the top layer of metal of the integrated circuit. Organic emissive medium 20 is then sandwiched between the anode and co-doped zinc oxide cathode 30. Aluminum ohmic contacts 38 are deposited and patterned on cathode 30. Connection between ohmic contacts 38 and the integrated circuit may be by wire-bonding or other metal interconnect means. An encapsulating layer 36 protects the device from environment. This device is a miniature emissive display integrated monolithically with the driving circuit on silicon substrate. Magnifying lenses may be attached or positioned in alignment with the display to enlarge the viewing area perceived by the viewer.

Figure 6:
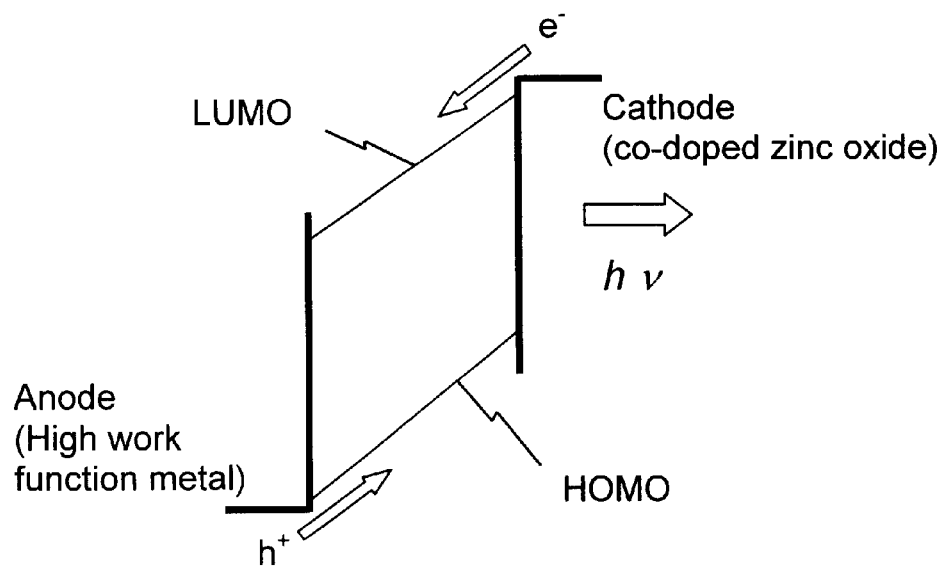
FIG. 6 illustrates a potential energy barrier diagram for an OLED device having the co-doped zinc oxide thin film cathode and a high work function anode of the present invention.

The embodiments described in conjunction with FIG. 3, FIG. 4 and FIG. 5 take advantage of the properties of co-doped zinc oxide for having high optical transmission, low work function, low deposition temperature and excellent chemical stability. Referring now to FIG. 6, the potential barriers associated with display devices 40 and 50 is shown. The use of the co-doped zinc oxide cathode and the high work function metal anode facilitates alignment of the Fermi levels of the anode and cathode with the LUMO and HOMO of the organic medium, respectively. The result minimizes or reduces the hole and electron transport barriers. Removing these barriers permits a lower operating voltage and higher efficiency. The lower operating voltage minimizes internal heat generation and should improve the life span of the display. Advantageously, inexpensive, efficient and lightweight light emissive displays are now possible in a small form factor.

Figure 7:
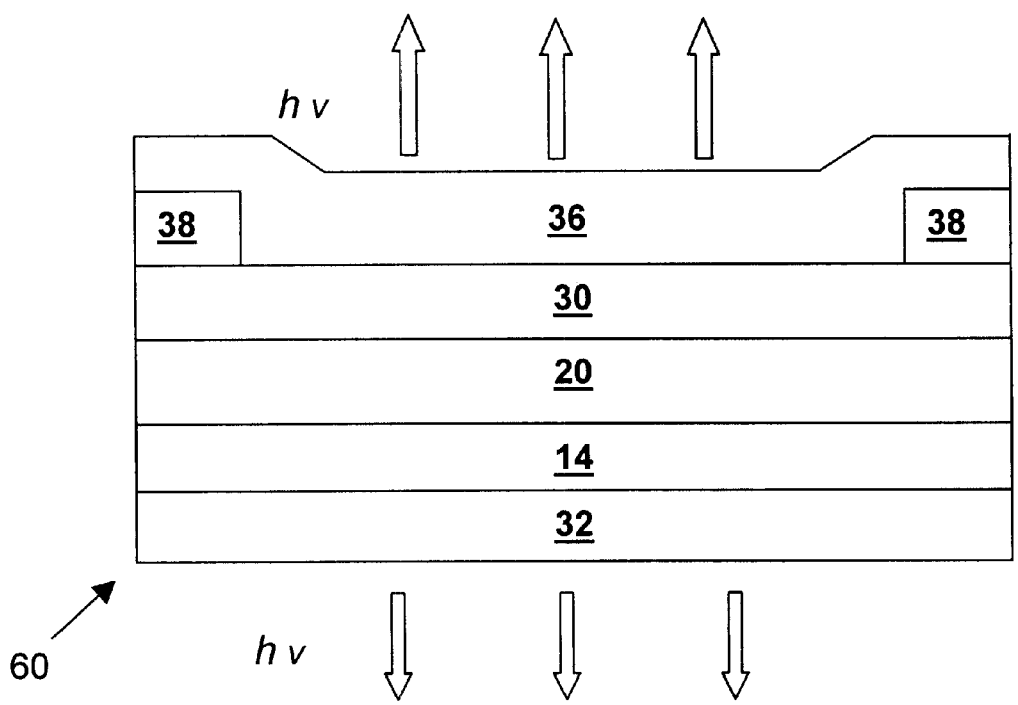
FIG. 7 illustrates a schematic representation of an OLED having an ITO anode on a glass substrate and a co-doped zinc oxide cathode.

Another embodiment, a bi-directional OLED device, is illustrated in FIG. 7. The term "bi-directional" means light emissions transmit through both the anode and the cathode. In device 60, anode comprises a thin film of ITO 14 deposited on a transparent substrate 32. Once anode 14 is patterned, organic medium 20 is deposited on top of anode 14. The manner of deposition, and selection of the thickness of medium 20 is an engineering consideration dependent on the particular choice of medium 20 and on the intended application as previously described. Cathode 30 comprises a co-doped zinc oxide film that is deposited on medium 20. Once deposited or during deposition, cathode 30 is patterned such that the relationship between the anode and the cathode electrodes will cooperate to form the desired pattern. Patterning is preferably performed using well-known semiconductor processing techniques such as a shadow mask. A contact layer 38 is deposited on cathode 30 and then patterned, again using known patterning and etching techniques to form contacts 38. Contacts 38 may be aluminum, or other materials that form ohmic contacts with co-coped zinc oxide. The contact layer material is also deposited at low temperature. A protective transparent passivation layer 36 is deposited on to of the contacts 38 and the exposed portion of cathode 30 to provide protection from the environment.

With medium 20 sandwiched between the two electrodes, light is generated when the electrodes are electrically activated. When a voltage of sufficient magnitude is applied across anode 14 and cathode 30, electrons are injected into medium 20 from the cathode and holes are injected into medium 20 from the anode. When the injected holes and electrons combine in medium 20, light is emitted. Since anode 14, substrate 32, cathode 30, and encapsulation layer 36 are all transparent, the generated light, hv, is transmitted bi-directionally through the top and bottom sides of the device. Lenses, reflector or other display elements may be placed on either the top or bottom side or on both sides of the device.

Referring now to FIG. 8, another preferred display embodiment of the present invention is illustrated in the context of a field emission display (FED) device. Display 70 is a portion of a FED device showing a single pixel of a two-dimensional matrix or grid-like pattern. Each pixel consists of three basic components: an emitter 78, a gate 82, and phosphor layer 86 on the anode 88.

When a stream of electrons 92, emitted from emitter 78, strikes phosphor layer 86, light is produced. Each emitter 78 is coupled to a cathode electrode 74 by a resistive layer 76. The region between emitter 78 and layer 86 forms a cavity 84 that is hermetically sealed and evacuated so that there is a vacuum between emitter 78 and phosphor layer 86. A gate electrode 82, which is isolated from the emitter by insulating layer 80, modulates the electric field applied to each emitter 78. It controls the number of electrons, which pass from the emitter to the anode. Upon application of a voltage between gate 82 and the cathode electrode 74, the stream of electrons 92 is emitted and accelerated toward phosphor layer 86 by the electric field between cathode 74 and the anode 88. Light generated by electrons impacting the phosphor is emitted through the transparent anode electrode 88 and transparent substrate 90.

Electron emitters are formed by a number of known processes including selective etching, selective growth, surface roughening by the bombardment of energized particles, or deposition through shadow masks. FIGS. 9A–9C illustrate some common shapes for the emitter such as a cone 92, a post 94 or a sharp ridge 96. Other prior art also employ emitters comprising random surface structures with sharp edge features. Regardless of the actual emitter shape, it is also desirable for the emitter material to be oxidation resistant and have a low work function. For these reasons, the preferred embodiment of the present invention includes a thin coating 98 of co-doped zinc oxide deposited on at least the top portion of emitters 92, 94 and 96. The coating of co-doped zinc oxide lowers the work function thereby improving the efficiency of the display device. Further, it is well known that during operation of display 70 of FIG. 8, residual gas and constant outgassing from the vacuum cavity surface will decrease the vacuum in region 84 over time. Without the co-doped zinc oxide coating, it is common for a layer of oxide to form on the emitters as the vacuum level decreases. This oxide layer acts as an insulator that increases the work function of the emitter and decreases the electron stream for a given field strength. This increase in work function requires a higher operating voltage to maintain a constant electron stream. It is believed that the layer of co-doped zinc oxide 98 (FIGS. 9A–9C) forms a barrier layer to oxidation. Further, the co-doped zinc oxide layer lowers the work function of the emitters, so the FED device should achieve improved emission efficiency and longer lifetime compared to silicon or metal emitters of the prior art.

A coating of the chemically stable co-doped zinc oxide may also be incorporated in other high-density field emission applications such as silicon or tungsten cold cathodes. (that is, a stand-alone room temperature operating electron source), vacuum microelectronic devices or field emission light sources in accordance with the present invention. This coating increases the emitter's resistance to oxidation and enhances the electron emission efficiency.

Figure 10:
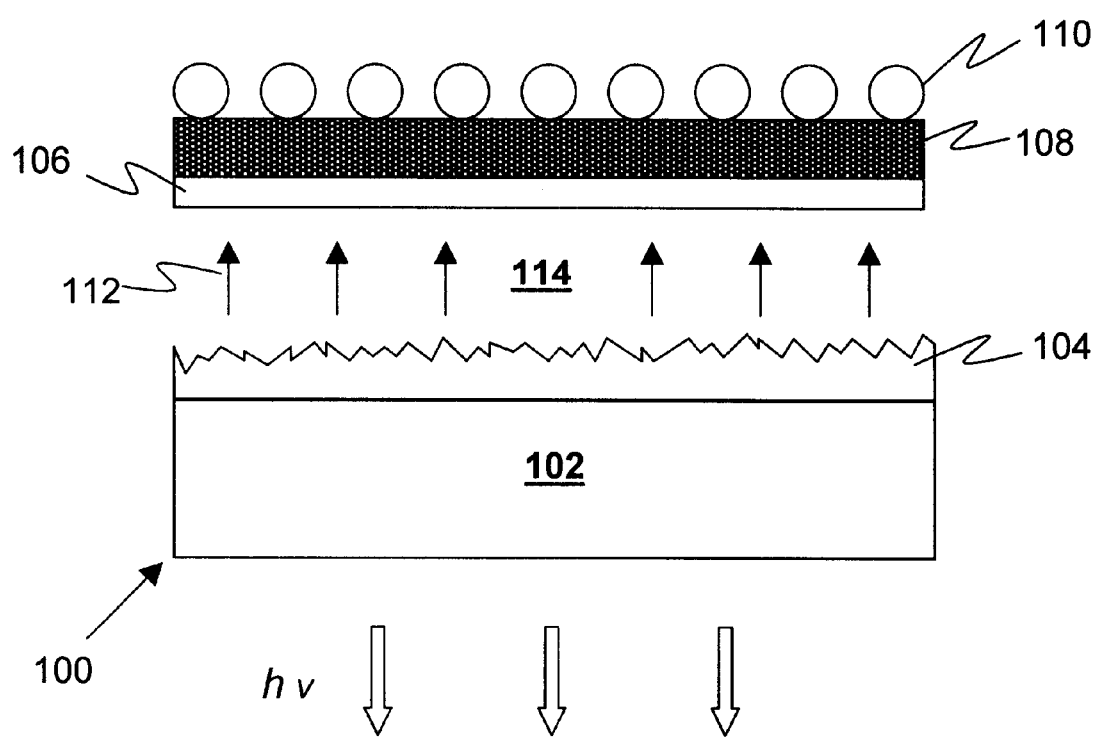
FIG. 10 illustrates another schematic representation of a second embodiment of a field emission light source of the present invention.

FIG. 10 discloses yet another preferred embodiment of the present invention. In this embodiment, a field emission light source 100 has a phosphor layer 106 applied to a thermal conductor such as a patterned metal plate 108 and transparent co-doped zinc oxide emitters 104 deposited on a transparent substrate 102. The emitters of light source 100 consist of a dense array of sharp microstructures fabricated by applying a thin film coating of co-doped zinc oxide over microstructures prefabricated on the transparent substrate. Alternatively, the emitters my comprise microstructures of thick co-doped zinc oxide film etched to obtain sharp microstructures using dry or wet etching techniques.

During operation of light source 100, emitters 104 generate streams of electrons 112 when energized. A voltage is applied between the metal anode 108 and the emitters 104 to attract and accelerate the electrons to bombard onto the phosphor 106 and generate light. Light emits through the transparent emitters. Heat generated during electron/phosphor interaction is dissipated into the metal anode which acts as a heat sink. Heat removal may be either passive by radiating from metal anode or actively, by way of example, by having coolant circulating through cooling tubes 110 attached to the back of the metal anode. With this configuration, the field emission light source is capable of operating at very high power levels to emit intense light without overheating.

In the various embodiments of the present invention, display devices are described in which the display device generates an emission of light without the necessity of a bulky external light source. Display devices of the present invention have a small form factor, are lightweight and are readily integrated with drive or control circuits on a single integrated circuit device.

While certain exemplary preferred embodiments have been described and illustrated in the accompanying drawings, it is to be understood that such embodiments are merely illustrative of and not restrictive on the broad invention. Further, it is to be understood that this invention shall not be limited to the specific construction and arrangements shown and described since various modifications or changes may occur to those of ordinary skill in the art without departing from the spirit and scope of the invention as claimed.

We claim:

1. A device for generating electromagnetic radiation, comprising:
   an anode;
   a cathode comprising a patterned layer of ZnO doped with gallium and hydrogen in concentrations sufficient to lower the work function of the cathode and substantially reduce the potential energy barrier to injection of electrons into the light emitting element; and
   a light emitting medium sandwiched between the anode and cathode.

2. The device of claim 1, wherein the anode comprises a high work function metal having a Fermi level which substantially matches the highest occupied molecular orbital energy of the light emitting medium.

3. The device of claim 2, wherein the anode high work function metal is selected from the group consisting of gold, platinum and selenium-aluminum.

4. The device of claim 1, wherein the ZnO cathode has a work function which substantially matches the lowest unoccupied molecular orbital energy of the light emitting medium.

5. The device of claim 4, wherein the co-doped ZnO portion of the cathode is doped with gallium and hydrogen in concentrations sufficient to lower the work function of the cathode and substantially reduce the potential energy barrier to injection of electrons into the light emitting element from the cathode.

6. The device of claim 1, wherein the light emitting medium comprises a light emitting organic polymer.

7. The device of claim 6, further comprising a substrate, wherein the cathode is disposed on the substrate.

8. The device of claim 7, wherein the substrate is a flexible substrate.

9. The device of claim 8, wherein the substrate is selected from the group consisting of acrylics, urethanes, polystyrenes, polycarbonates, styrene-acrylonitrile copolymers, styrene-butadiene copolymers, cellulosics, acrylonitrile-butadiene-styrene, polyvinylchloride, thermoplastic polyesters, polypropylene, nylons, polyester carbonates, ionomers, polyethyleneterephthate, and cyclic olefin copolymers.

10. The device of claim 1, wherein the cathode is transparent to at least a portion of the electromagnetic spectrum.

11. The device of claim 10, wherein the co-doped ZnO portion of the cathode comprises a thin film of co-doped ZnO.

12. The device of claim 11, wherein the co-doped thin film ZnO portion of the cathode is doped with gallium and hydrogen in concentrations sufficient to lower the work function of the cathode and substantially reduce the potential energy barrier to injection of electrons into the light emitting element from the cathode.

13. The device of claim 10, further comprising a passivation layer covering the cathode.

14. The device of claim 1, wherein the anode is substantially transparent to at least a portion of the electromagnetic spectrum.

15. The device of claim 14, wherein the anode comprises a thin film of conducting indium tin oxide.

16. The device of claim 1, wherein the anode and the cathode are substantially transparent to at least a portion of the electromagnetic spectrum.

17. The device of claim 2, further comprising a semiconductor substrate, wherein the anode is disposed on the semiconductor substrate.

18. The device of claim 17 further comprising an ohmic means for electrically coupling the cathode to the semiconductor substrate.

19. The device of claim 18, wherein the semiconductor substrate further includes an integrated circuit for controlling the voltage applied between the anode and the cathode.

20. The device of claim 2, wherein the light emitting medium comprises a light emitting Fluorescent metal chelate complex.

21. The device of claim 2, wherein the light emitting medium comprises a hole transport layer disposed proximate to the anode and an electron transport layer disposed proximate to the cathode.

22. An emissive display formed on a silicon substrate together with an integrated circuit adapted to controlling the display of information on the emissive display, the emissive display comprising:

A layer of insulating oxide deposited on the integrated circuit;

An anode formed on the oxide and electrically coupled to the integrated circuit;

A layer of organic light emissive medium deposited on the anode;

A co-doped zinc oxide cathode formed proximate to the organic light emissive medium such that the emissive medium is sandwiched between the anode and cathode, the cathode having a plurality of ohmic contacts, the co-doped zinc oxide comprising zinc oxide doped with gallium and hydrogen;

Means for electrically coupling the ohmic contacts with the integrated circuit; and An encapsulating layer for protecting the emissive display.

23. The display of claim 22, wherein said anode comprises a high work function metal having a Fermi level substantially matching the highest occupied molecular orbital energy of the light emissive medium.

24. The display of claim 22, wherein said high work function metal is selected from the group consisting of gold, platinum and selenium-aluminum.

25. The display of claim 22, wherein the co-doped zinc-oxide cathode is doped with gallium and hydrogen in concentrations sufficient to lower the work function of the cathode and substantially reduce the potential energy barrier to injection of electrons into the light emitting medium.

26. The display of claim 22, wherein the light-emitting element comprises a light-emissive organic polymer.

27. The display of claim 22 further comprising a magnifying lens positioned in alignment with the emissive display.

* * * * *